United States Patent [19]

McElroy

[11] 4,142,111
[45] Feb. 27, 1979

[54] ONE-TRANSISTOR FULLY STATIC SEMICONDUCTOR MEMORY CELL

[75] Inventor: David J. McElroy, Houston, Tex.

[73] Assignee: Texas Instruments Incorporated, Dallas, Tex.

[21] Appl. No.: 762,916

[22] Filed: Jan. 27, 1977

[51] Int. Cl.² .................. H03K 3/353; G11C 11/34
[52] U.S. Cl. .................... 365/178; 307/279; 307/304; 307/238; 365/182; 365/186
[58] Field of Search ............ 307/238, 279, 304; 340/173 R

[56] References Cited

U.S. PATENT DOCUMENTS 4,000,427  12/1976  Hoffmann ................... 307/238

OTHER PUBLICATIONS

K. Helwig, "Dynamic 4-Fet Storage Cell", IBM Technical Disclosure Bulletin, vol. 15, No. 7, Dec. 1972, pp. 2205-2206.

Primary Examiner—John Zazworsky
Attorney, Agent, or Firm—John G. Graham

[57] ABSTRACT

A cell for a semiconductor memory of the static type employs only one conventional MOS transistor, along with a field implanted resistance and a vertical P-channel junction-type field effect transistor. These elements, along with a resistor element which may be another field implanted resistance or a polysilicon implanted resistance, provide a circuit which is stable with either a "1" or "0" stored. No clock or other refresh circuitry is needed.

19 Claims, 10 Drawing Figures

ONE-TRANSISTOR FULLY STATIC SEMICONDUCTOR MEMORY CELL

BACKGROUND OF THE INVENTION

This invention relates to semiconductor memory devices and more particularly to a static memory cell using "MOS" semiconductor processing.

The most widely used semiconductor memory devices at present are one-transistor dynamic memory cells as described in U.S. Pat. No. 3,940,747, issued Feb. 24, 1976 to Kuo and Kitagawa, assigned to Texas Instruments. Higher density versions of these dynamic memory systems are shown in Electronics, May 13, 1976, pp. 81–86 and U.S. patent applications Ser. No. 691,734, filed June 1, 1976 by Lionel White and N. Kitagawa, Ser. No. 648,594 filed Jan. 12, 1976 and Ser. No. 722,841 filed Sept. 13, 1976 by C-K Kuo, all assigned to Texas Instruments. These high density devices use one-transistor dynamic memory cells which have the advantage of very small size, but require sense amplifiers capable of distinguishing a few hundred millivolts, and dissipate considerable power in large arrays; primarily, however, dynamic memories suffer from the disadvantage of requiring external refresh systems. The arrays must be addressed periodically to restore the data, since the stored voltages will leak off the capacitors in the memory cells, imposing both time and hardware burdens on the system. Static memory cells of the type set forth in copending application Ser. No. 691,252, filed May 28, 1976, By G. R. Mohan Rao, assigned to Texas Instruments, avoid the need for refresh, but at the expense of larger cell size and increased power dissipation. Various types of "self-refreshing" cells have been proposed, one example of which is shown in Digest of Technical Papers, 1976 IEEE Solid State Circuits Conference, p. 132, on Automatic Refresh Dynamic Memory. Another is shown in U.S. Pat. No. 3,955,181, issued May 4, 1976 to Joseph H. Raymond, Jr., for Self-Refreshing Random Access Memory Cell, assigned to Texas Instruments. Self-refresh RAM cells of very simple construction are shown in pending U.S. patent applications Ser. No. 700,989, filed June 29, 1976, by G. R. Mohan Rao, David J. McElroy and Gerald D. Rogers, and Ser. No. 754,208, filed Dec. 27, 1976, by D. J. McElroy, both assigned to Texas Instruments. These prior cells provide apparently static operation in that refresh is accomplished without addressing the cells. Prior self-refresh cells, however, have exhibited either large cell size or excessive power dissipation, or required additional connections and contacts, neither of which is compatible with high density memories of the 16K or 64K variety. Others have required clocking or other timing signals, or have exhibited a high degree of process dependence on Vt or other parameters, i.e. low yield.

It is a principal object of this invention to provide improved memory cells in semiconductor integrated circuits. Another object is to provide an improved static cell for MOS memory devices, particularly a static cell of small size and not requiring clock inputs. An additional object is to provide small area, self-refreshing memory elements in semiconductor integrated circuits, particularly with low power dissipation and made by processes compatible with MOS/LSI standard products.

SUMMARY OF THE INVENTION

In accordance with one embodiment of the invention, a memory cell is provided which includes a read/write or transfer transistor which is connected between the bit line and a first storage node. This storage node is connected to a voltage supply through a field implanted resistor and another resistor, and a node between these elements is connected to the gate of a vertical p-channel junction field effect transistor. The field implanted resistor switches between a high impedance state and a low impedance state depending upon whether a "1" or a "0" is stored. The resistor is provided by an ion implanted region located beneath a thick silicon oxide layer grown after the implant step. The other resistor may be made this way, or it may be an implanted polycrystalline silicon resistor. The storage node is held at ground by conduction through the p-channel device when a "0" is stored. These devices together create a static flip-flop which is stable with either a "1" or a "0" on the storage nodes. Thus, one conventional MOS transistor, one (or two) field-implanted resistor, along with the vertical p-channel junction FET, provide a static cell, with no clock voltages required.

BRIEF DESCRIPTION OF THE DRAWINGS

The novel features believed characteristic of the invention are set forth in the appended claims. The invention itself, however, as well as other features and advantages thereof, will be best understood by reference to the following detailed description of illustrative embodiments, read in conjunction with the accompanying drawings, wherein:

FIGS. 3(a-f) are elevation views in section of the cell of FIG. 2, taken along the lines a—a, b—b, c—c, d—d, e—e and f—f respectively, in FIG. 2;

FIGS. 4(a-e), 5(a-e) and 6(a-e) are elevation views in section of the semiconductor device of FIGS. 2 and 3(a-f), at successive states in the manufacturing process, taken along the lines e—e, d—d, and f—f, respectively, in FIG. 2;

DETAILED DESCRIPTION OF SPECIFIC EMBODIMENT

Figure 1:
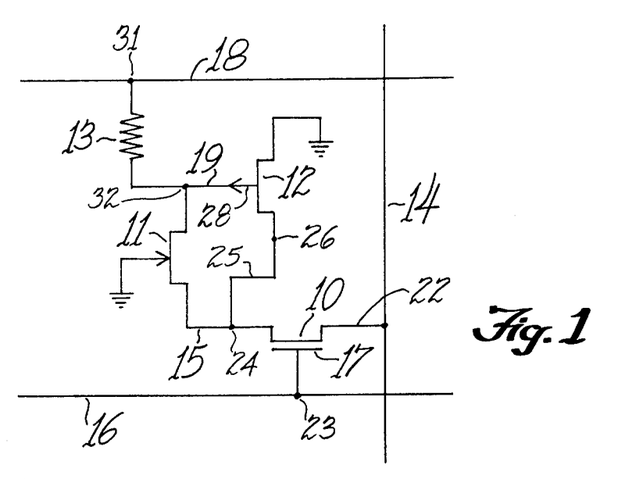
FIG. 1 is an electrical schematic diagram of the static memory cell of the invention.

With reference to FIG. 1, a memory cell according to the invention includes a conventional N-channel MOS transistor 10, a field implanted resistor 11, and a vertical P-channel junction field effect transistor 12, along with a resistor 13 which is of the implanted poly type in this embodiment. The transistor 10 is a transfer or input-/output device and is connected between a bit line 14 and a storage node 15. An address line 16 is connected to the gate 17 of the transistor 10. The transistor 11 functions in either a high or low impedance mode, depending on whether a "1" or "0" is stored on the node 15, and is connected to a positive "Vcc" voltage supply line 18 through the resistor 13, as well as to a node 19 which is the gate of the p-channel transistor 12. The cells could be duplicated in an array by reflecting about the Vcc line 18.

Figure 2:
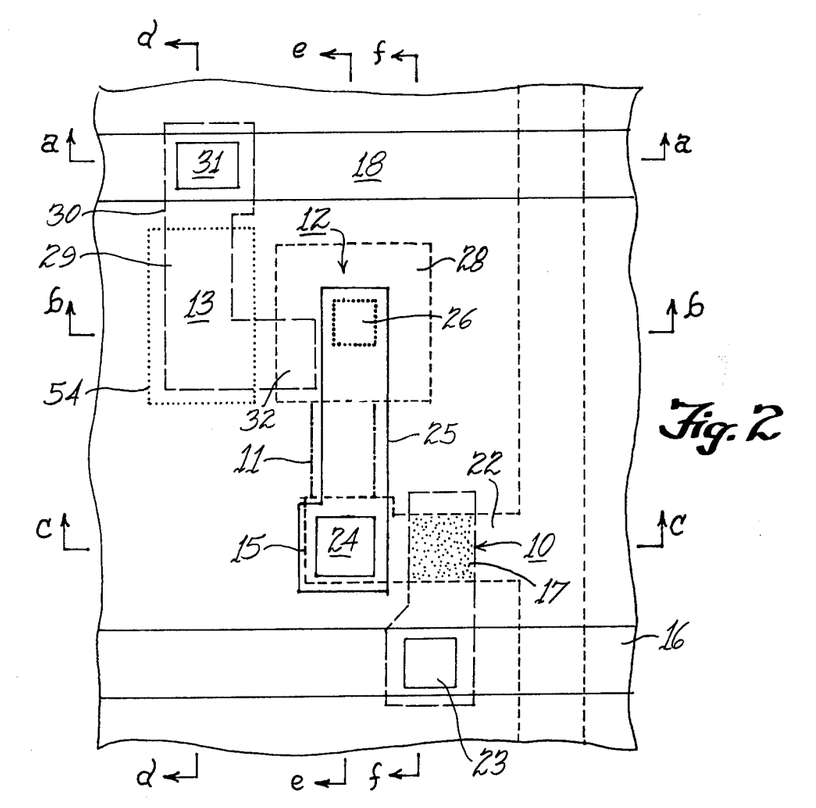
FIG. 2 is a greatly enlarged plan view of a small portion of a semiconductor chip showing the physical layout of the cell of FIG. 1 using a field implanted resistor and a vertical JFET according to the invention.
Figure 3:
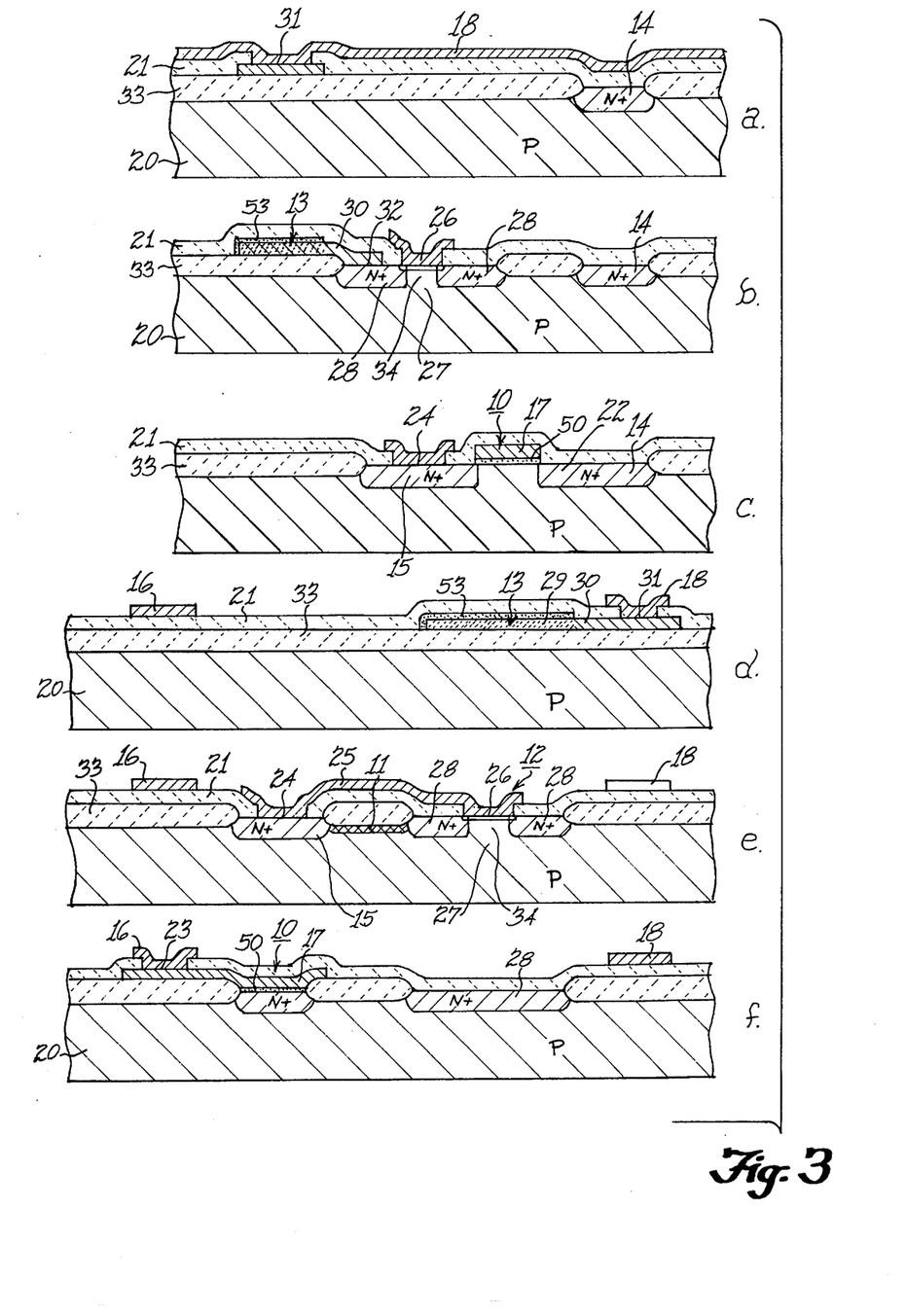

In FIG. 2, and the associated sectional views of FIGS. 3(a-f), an MOS cell layout is shown incorporating the memory cell of FIG. 1. A very small part 20 of a semiconductor bar is seen, it being understood that a memory device would usually contain perhaps 4096 or 16384 or other power of two of the cells on a silicon chip of less than one-tenth square inch. The Vcc and address lines 16 and 18 are metal strips overlying a silicon oxide insulating layer 21 on the top face of the chip. The bit line 14 is an elongated N+ diffused moat region within the silicon chip, and a part of this N+ region provides the source 22 of the transistor 10. The gate 17 of the transistor 10 is a doped polycrystalline silicon layer which is connected to the metal line 16 at a metal-to-poly contact area 23. A continuation of the N+ diffused moat forms the drain of the transistor 10 and the node 15, along with one terminal of the implanted region of the transistor 11 and a metal-to-moat contact area 24. The connection 25 to the source 26 of the transistor 12 is formed by an aluminum strip which extends from the metal-to-moat contact area 24 at the node 15 to the source 26. The drain 27 of the transistor 12 is the original p-type material below the source 26. The gate 28 of this device is an N+ collar region formed in a moat. The resistor 13 is formed in an ion implanted area 29 of a polycrystalline silicon strip 30 which terminates in a metal-to-poly contact area 31 on one end and a poly-to-moat contact area 32 on the other end. An ion implanted region beneath thick field oxide 33 which surrounds the moats creates the field effect resistor 11 between an N+ region of the node 15 and a part of the N+ collar shaped moat region of the gate 28.

the field-implanted resistor 11 is made by the method described in pending application Ser. No. 691,252, filed May 28, 1976 by G. R. Mohan Rao, and Ser. No. 700,989, filed June 29, 1976 by G. R. Mohan Rao, David J. McElroy and Gerald D. Rogers, both assigned to Texas Instruments. The implanted polysilicon resistor 13 is made by the method described in pending application Ser. No. 727,116, filed Sept. 27, 1976 by G. R. Mohan Rao, John S. Stanczak, Jih-Chang Lien, and Shyam Bhatia, assigned to Texas Instruments.

In operation of the memory cell of FIGS. 1-3, the resistor 11 functions as an N-channel junction field effect transistor and will exhibit a resistance value which is dependent upon its source and drain voltage, i.e., upon the voltages existing on the nodes 15 and 19. When the voltage on the node 15 is high or about Vcc (+10 to +12 v., a logic "1" stored), the depletion region created by the back-biased junction between the substrate 20 and the implanted region of the resistor 11 is wide and the apparent resistance exhibited by the device is very high, perhaps in excess of hundreds of megohms per square. When the voltage on the node 15 is low or about Vss (a logic "0" stored), the apparent resistance is many orders of magnitude lower. The resistor 11 functioning in this manner, and the resistor 13, along with the transistor 12, causes the node 19 to be at either a stable "1" or "0" level. The transistor 12 exhibits a high impedance when its gate 28 is highly positive because its channel 34 will be pinched off by the resultant depletion region extending out from the P-N junction between the collar shaped N+ gate 28 and the P-type substrate. When the node 19 and the gate 28 are at ground, the depletion region disappears, and the impedance of the transistor 12 is very small, so the nodes 15 and 19 are discharged to ground through resistor 11, conductor 25 and transistor 12. Current flow in this path causes a drop across the resistor 13, holding the node 19 near Vss. Thus the circuit is stable in either state and it acts as a static flip-flop.

A "1" is stored by addressing the line 16, turning on the transistor 10, and charging the node 15 from a "0" to Vdd voltage on the bit line 14. This causes the resistor 11 to exhibit very high impedance, so the current flow through the resistor 13 is very low and the node 19 is at or near the voltage on the line 18, holding the transistor 12 off. The node 19 charges from the positive supply line 18 when the resistor 11 and transistor 12 are at their high impedance state keeping the node 19 high, so a "1" is sustained.

A "0" is stored when the bit line 14 is at Vss and the transistor 10 is addressed, discharging the node 15 into the bit line. When the node 15 is at Vss, the impedance of the resistor 11 is low, the current flow through and drop across the resistor 13 is high, so the node 19 is low, turning on the transistor 12, so a "0" level is sustained on the node 19 by current flow through resistor 11, conductor 25 and transistor 12. Also, the node 15 is connected to the Vss by the low impedance of the transistor 12, holding the resistor 11 at low impedance, further tending to enhance a "0" level.

Figure 4:
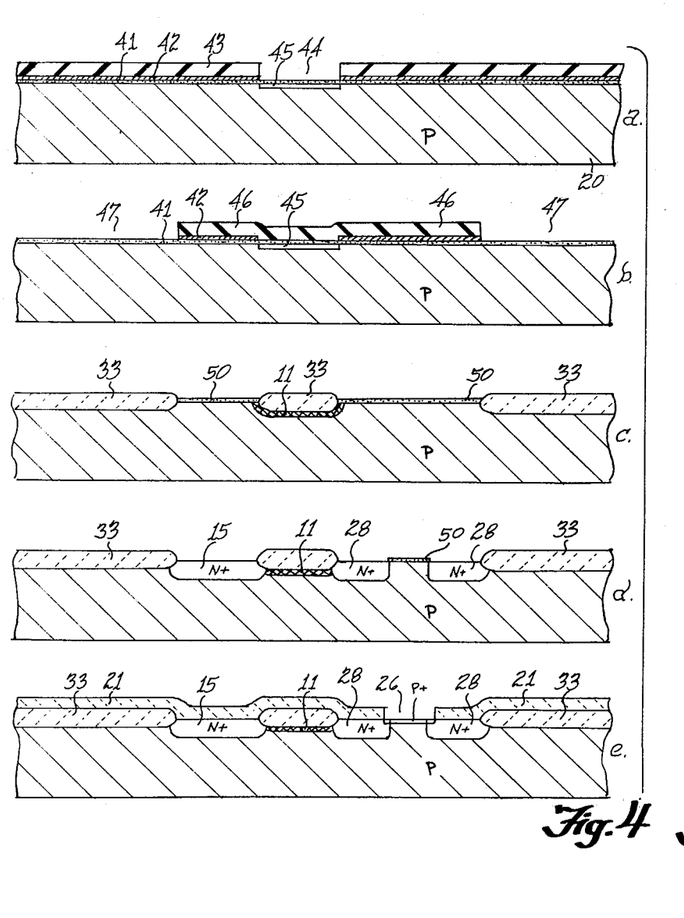
Figure 5:
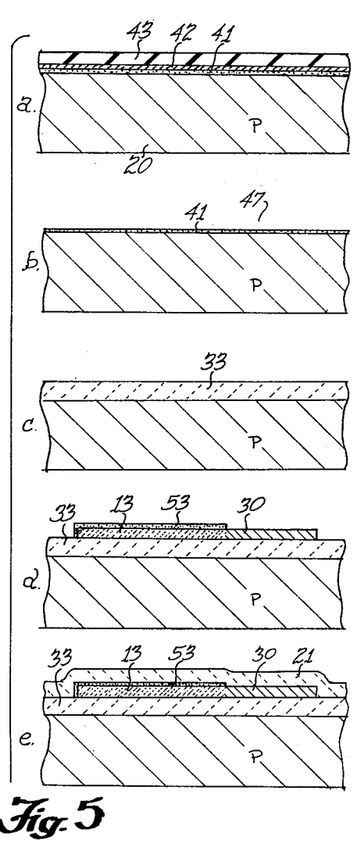
Figure 6:
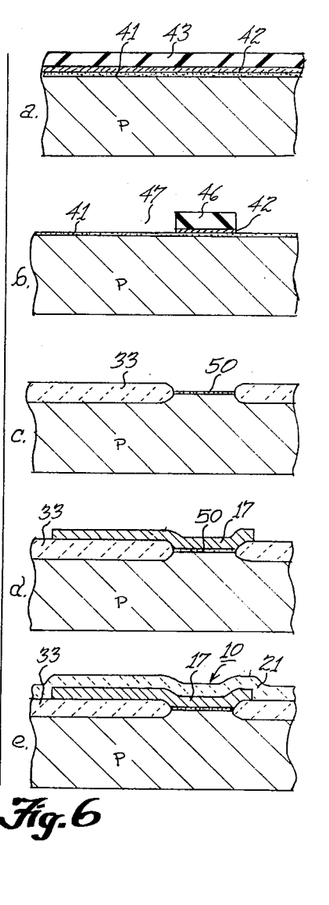

Referring now to FIGS. 4(a-e), a process for making the integrated circuit device of FIGS. 2 and 3(a-f) will be described. FIGS. 4(a-e) represent a sectional view along the line e—e of FIG. 2, chosen to illustrate formation of the vertical transistor 12, and the field-implanted resistor 11. FIG. 5a-5e is part of the section d—d of FIG. 2, illustrating formation of the implanted poly resistor 13. FIGS. 6a-6e are part of the section f—f of FIG. 2, showing formation of the MOS transistor 10. The starting material is a slice of P-type momocrystalline silicon perhaps 3 inches in diameter and 20 to 40 mils thick, cut on the <100> plane, of a resistivity of about 6 to 8 ohm-cm. In FIGS. 2, 3 or 4, the part shown of a chip or bar 20 represents only a very small part of the slice, perhaps 2 or 3 mils wide. After appropriate cleaning, the slice is oxidized by exposing to oxygen in a furnace at an elevated temperature of perhaps 1000° C. to produce an oxide layer 41 of a thickness of about 1000Å. Next, a layer 42 of silicon nitride of about 1000Å thickness is formed by exposing to an atmosphere of silane and ammonia in an rf plasma reactor. A coating 43 of photoresist is applied to the entire top surface of the slice, then exposed to ultraviolet light through a mask which defines the desired pattern, and developed. This leaves an area 44 where nitride is to be etched away by a nitride etchant which removed the exposed part of the nitride layer 42 but does not remove the oxide layer 41 and does not react with the photoresist 43. In this area 44 the resistor 11 is to be formed.

The slice is now subjected to an ion implant step, whereby pohsphorus atoms are implanted in the exposed area 44 of silicon not covered by photoresist 43 and nitride 42 to create an area 45 which will be the field implanted resistor 11. The photoresist could have been removed, but preferably is left in place as it also masks the implant. The oxide layer 41 is left in place during the implant because it prevents the implanted phosphorus atoms from out-diffusing from the surface during subsequent heat treatment. This implant is at a dosage of about $5 \times 10^{10}/cm^2$ at 70 to 150 KeV. The selection of energy level used will provide a control over the cut-off voltage, with higher energy level providing a higher cut-off.

As will be seen, the region 45 does not exist in the same form in the finished device, because some of this part of the slice will have been consumed in the field oxidation procedure.

Next, the photoresist coating 43 is removed and another photoresist coating 46 is applied over the entire slice, then exposed to UV light through a mask which exposes everything except what is to become the moats, i.e. bit line, the transistors and N+ diffused regions. Upon developing, unexposed photoresist is removed in areas 47 in FIGS. 4b, 5b and 6b. The region 45 where resistor 12 will be created is covered. The nitride layer 42 is etched away in the areas 47, the oxide 41 is left in place as before, and then the slice is subjected to a boron implant at 100 KeV at a dosage of about $4 \times 10^{12}/cm^2$. Heavily doped P+ regions (not shown) will be produced in the surface to ultimately provide the channel stop regions. The remaining photoresist 46 then would be removed.

The following step in the process is formation of field oxide 33, which is done by subjecting the slices to steam or an oxidizing atmosphere at about 900° C. for perhaps 10 hours. This causes a thick field oxide layer 33 to be grown as seen in FIGS. 4c, 5c, and 6c; this layer extends into the silicon surface because silicon is consumed as it oxidizes. The nitride layer 42 masks oxidation beneath it. The thickness of this layer 33 is about 8000 to 10,000Å, about half of which is above the original surface and half below. The boron doped P+ channel stop regions and the phosphorus doped N region 45 formed by implant, and usually modified by an anneal step, will be partly consumed, but will also diffuse further into the silicon ahead of the oxidation front. The N resistor region 11 will result which will be deeper and of more uniform and acceptable concentration at the surface and have less crystalline structure damage compared to what would have resulted without the high temperature steps.

The nitride layer 42 and its underlying oxide layer 41 are removed by etching, as the next step, and another thin oxide layer 50 of about 800Å is grown over the exposed areas of silicon. This layer 50 later becomes the gate insulators of the MOS transistors as well as capacitor dielectric in other parts of the device if needed. Then windows for polysilicon to silicon contacts 24, 32, etc. are patterned and etched in the oxide layer 50 using photoresist. A layer of polycrystalline silicon is deposited over the entire slice in a reactor using standard techniques as by decomposition of silane in hydrogen at about 930° C. to produce a thickness of about 0.5 micron. This polysilicon will become the MOS transistor gate 17 and the strip 30.

The entire polysilicon coating is now subjected to a phosphorus implant which creates the characteristics of the resistor 13. Areas of poly which are to be highly conductive will be later subjected to a phosphorus diffusion which will leave them highly doped. To define the resistor, this implant is at 100 to 140 KeV to a dosage of from $5 \times 10^{13}$ to $1 \times 10^{14}$ atoms per cm$^2$, depending upon the desired sheet resistivity. Following this implant, the slice is annealled in N$_2$ for 30 minutes at 1000° C. to distribute the phosphorus properly in the polysilicon.

The polysilicon and underlying gate oxide or thin oxide layer 50 are next patterned by applying a layer of photoresist, exposing to ultraviolet light through a mask prepared for this purpose, developing, then etching with the remaining photoresist masking certain areas of the polysilicon. The resulting structure is seen in FIGS. 4d, 5d and 6d where a part of the remaining polysilicon layer provides what will be the gate 17 of MOS transistor 10, the strip 30 and the connection 25. The thin oxide 50 underneath the gate 17 is the gate oxide of the transistor. These same layers also provide gate and gate oxide for all the other transistors on the slice, as well as capacitors. After patterning the poly, a protective cap of silicon dioxide is grown over the polysilicon, producing a coating 53 on all exposed surfaces of the poly, including tops and sides. The coating 53 is grown at about 900° C. in steam for perhaps two hours, producing approximately 3000Å thickness and consuming part of the polysilicon. The cap is to prevent deposition of impurity on the resistor 13 or diffusion into the resistor.

A photoresist mask and etch operation is next used to remove the coating 53 on all areas of the polysilicon except the resistor 13 and the source contact area 26. The mask used to protect the resistor leaves oxide over the area defined by a dotted line 54 in FIG. 2; this is much wider than the resistor, allowing a rather wide margin for error in mask alignment. The resulting structure is seen in FIG. 5d.

Using the thin oxide 50, protective cap 53, and field oxide 33 as a diffusion mask, the slice is now subjected to an N+ diffusion, whereby phosphorus is diffused into the silicon slice 20 as seen in FIG. 4e to produce regions 15 and 28. Phosphorus diffuses into the exposed polysilicon which becomes heavily doped and very conductive. The poly does not mask the diffusion, so N+ regions are created beneath the poly where the oxide coating 50 or the cap 53 does not exist. For example, part of region 28 is formed by phosporus diffusion through poly 30 at silicon contact 32 in FIG. 3b. The depth of diffusion is about 8000Å. The N+ diffused regions function as conductors which connect the various regions together, and also function as the source or drain regions of all the MOS transistors.

Fabrication of the device is continued by depositing another layer 21 of phosphorus-doped oxide. Rather than by oxidizing, this is done by a low temperature reaction process using conventional chemical vapor deposition techniques. The layer 21 is about 6000Å, covering the entire slice. As seen in FIG. 4e, a photoresist mask and etch operation opens a window in the oxide coating at the position of the source contact 26 for the transistor 12, and a shallow p-type diffusion (2 or 3 lines deep) is performed to produce a contact region 52, self-aligned with the contact opening. Subsequently, by another photoresist mask and etch, windows are opened in the oxide layer 21 in areas 23 and 31 where contact is to be made to the polysilicon layer. Then, a layer of aluminum is deposited on the entire slice, and etched away using photoresist masking to provide the desired pattern of metal interconnections 16 and 18 and the strip 25.

Figure 7:
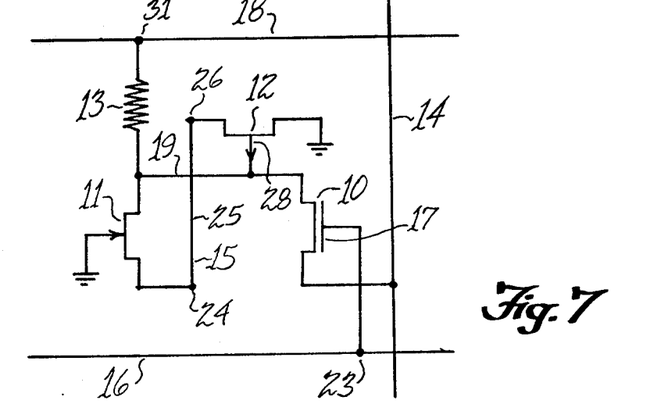
FIGS. 7 and 8 are an electrical schematic diagram and a plan view of a cell layout, respectively, of an alternative circuit for the cell of FIGS. 1 and 2.
Figure 8:
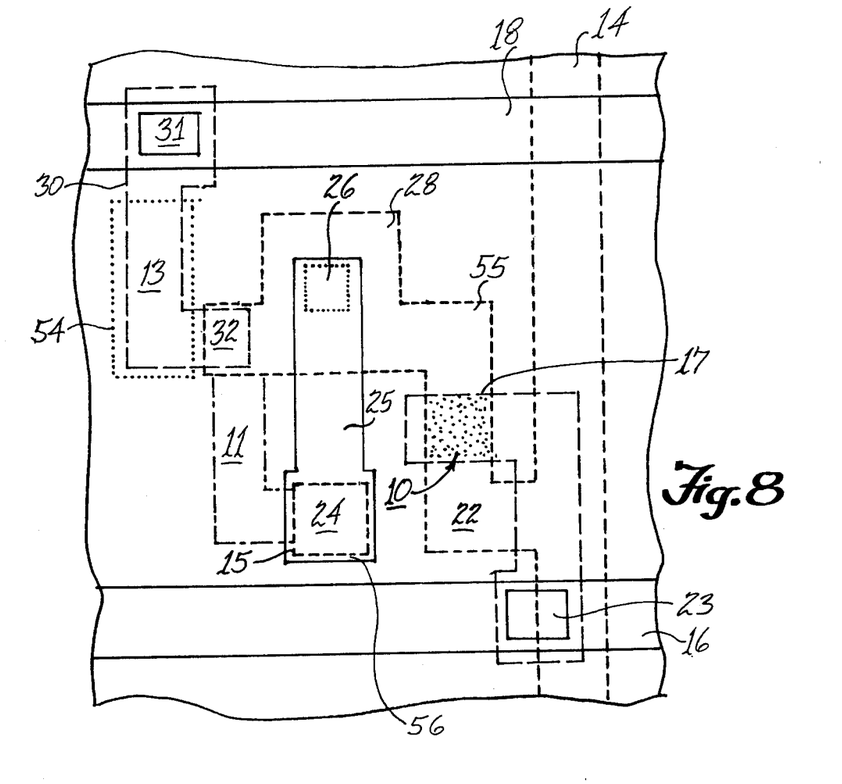

In FIGS. 7 and 8, another embodiment of the invention is shown which is exactly the same as the embodiment of FIGS. 1 and 2 except that the transfer transistor 10 is connected to the node 19 instead of the node 15. That is, the source-drain path of the transistor 10 is connected to the gate 28 of the vertical p-channel transistor 12 by an N+ diffused moat segment 55. Another N+ diffused moat segment 56 is added to function as the node 15 where contact 24 between one end of the field implanted resistor 11 and the poly connection 25 is made. In operation, addressing the cell by a positive voltage on the line 16 causes the node 19 to charge or discharge to the logic level on the bit line 14. If the bit line is at "1", this turns off the transistor 12 and causes the resistor 11 to assume its high impedance state. There will be little or no drop across the resistor 13, so the node 19 will be sustained at a "1" level from the positive supply line 18. If the bit line 14 had been at "0" level, the node 19 would discharge, the transistor 12 would go to a low impedance state as would the resistor 11, current would flow through the path from the resistor 13, the resistor 11, the connection 25, the transistor 12 to ground; the drop across the resistor 13 is high and the node 19 is sustained at near Vss.

Figure 9:
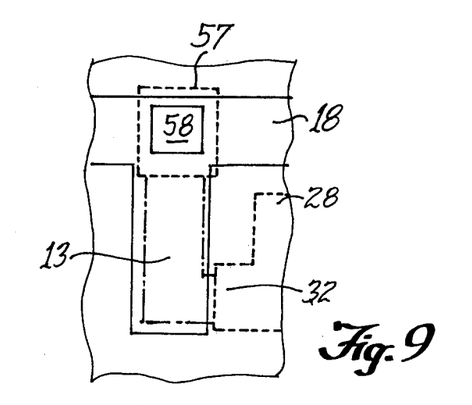
FIGS. 9 and 10 are plan and elevation views of an alternative resistor element which may be used in the cell of FIGS. 1 and 2.
Figure 10:
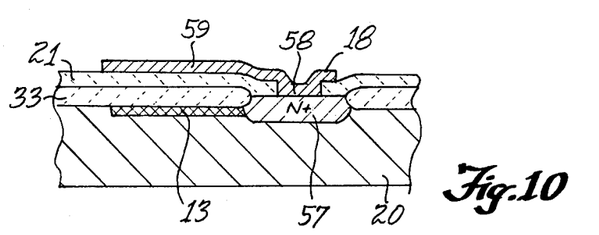

In FIGS. 9 and 10 an embodiment of the invention is shown wherein the resistor 13 is a field implanted resistor just like the resistor 11, instead of an implanted polysilicon resistor as in FIGS. 2-8. An implanted region buried under field oxide 33 connects the gate 28 to an N+ diffused moat segment 57, to which a metal-to-moat contact 58 is made to connect to the positive supply line 18 (instead of the metal-to-poly contact 31 as before). The advantage of this embodiment is that process complexity is minimized in that the steps of forming the implanted poly resistor need not be performed. Also, the source contact 26 may be implanted heavier to lower its resistance beneath the oxide cap 54. A section 59 of the metal of the positive voltage line 18 may extend down over the resistor 13 to raise the Vpx (cutoff voltage) of the resistor 13 due to the field from the Vcc voltage. The Vpx of the field implanted resistor 13 should be higher than the Vpx of the resistor 11. Another way of accomplishing this would be to implant the resistor 13 slightly more to give it a higher Vpx than resistor 11, but this would require another mask step.

While this invention has been described with reference to illustrative embodiments, this description is not intended to be construed in a limiting sense. Various modifications of the illustrative embodiments, as well as other embodiments of the invention, will be apparent to persons skilled in the art upon reference to this decription. It is, therefore, contemplated that the appended claims will cover any such modifications or embodiments as fall within the true scope of the invention.

What is claimed is:

1. A semiconductor integrated circuit comprising an MOS transistor having a source-drain path and a gate, the source-drain path of the MOS transistor being connected between a first node and a source of logic voltages, the gate of the MOS transistor being connected to a different source of logic voltages, an implanted field effect resistor having a current path, the current path of the field effect resistor being connected between the first node and a second node, impedance means connecting the second node to a voltage supply, a vertically oriented field effect transistor having a source-drain path and a gate, the gate of the field effect transistor being connected to the second node, means connecting the first node through the source-drain path of the field effect transistor to a reference potential, the field effect resistor and the field effect transistor both exhibiting a low impedance state when the voltage on the first and second nodes is relatively low and exhibiting a high impedance state when the voltage on the first and second nodes is relatively high.

2. A circuit according to claim 1 wherein the impedance means is an ion implanted polycrystalline silicon resistor overlying thick field oxide.

3. A circuit according to claim 2 wherein the field effect resistor is a region within the semiconductor material formed by ion implant and having a low impurity concentration.

4. A circuit according to claim 3 wherein the region which forms the impedance element is buried beneath a thick thermal oxide layer.

5. A circuit according to claim 1 wherein the impedance means is a second field effect resistor formed by ion implant beneath a thick field effect layer.

6. A circuit according to claim 5 wherein the field effect transistor is of the P-channel p-n junction type and the gate region is an N+ arcuate region.

7. A circuit according to claim 1 wherein the source of logic voltages is a bit line in a memory array, the different source of logic voltages is an address line in the memory array, and the first node is a storage node capable of sustaining a logic "1" or logic "0".

8. A storage cell comprising an address line, a data line, first and second storage nodes, a first controlled switching device having a current path connecting the data line to one of the first and second storage nodes and being controlled by the address line, a voltage supply, impedance means connecting the second storage node to the voltage supply, voltage-controlled resistance means connecting the first storage node to the second storage node, the second storage node being connected to the control element of a second controlled switching device, the second controlled switching device connecting the first storage node to reference potential.

9. A storage cell according to claim 8 wherein the resistance means is responsive to the voltage on the first storage node.

10. A storage cell according to claim 9 wherein the resistance means has a first terminal connected to the first storage node and a second terminal connected to the second storage node, wherein means are provided for applying voltage at said terminals, and wherein the resistance means exhibits a large change in resistance when the voltage at said second terminal changes from near reference potential to near the value of the voltage supply.

11. A storage cell according to claim 10 wherein the second controlled switching device is a vertically oriented junction type field effect transistor.

12. A storage cell according to claim 11 wherein the second controlled switching device exhibits a large change in impedance when the voltage on the second storage node changes from near reference potential to near the value of the supply voltage.

13. A storage cell according to claim 12 wherein the cell is stable with either a logic "1" or a logic "0" on the first and second storage nodes.

14. A storage cell according to claim 13 wherein the first controlled switching device is an N-channel MOS transistor, the resistance means resembles an N-channel junction field effect transistor, and the second controlled switching device is a P-channel field effect transistor.

15. A storage cell according to claim 14 wherein the resistance means comprises an ion-implanted region beneath a thick, thermally-grown field oxide layer.

16. A storage cell according to claim 15 wherein the impedance means is an ion-implanted polycrystalline silicon strip overlying a thick field oxide layer.

17. A storage cell according to claim 15 wherein the impedance means is an ion-implanted region beneath a thick field oxide layer and resembles the resistance means.

18. A storage cell comprising an address line, a data line, first and second storage nodes, a first controlled switching device having a current path connecting the data line to one of the first and second storage nodes and being controlled by the address line wherein the first controlled switching device is an MOS transistor, a voltage supply, impedance means connecting the second storage node to the voltage supply, voltage-controlled resistance means connecting the first storage node to the second storage node, the second storage node being connected to the control element of a second controlled switching device, wherein the second controlled switching device is a vertically oriented junction-type field effect transistor, the second controlled switching device connecting the first storage node to reference potential.

19. A storage cell comprising an address line wherein the cell is within a semiconductor integrated circuit, a data line, first and second storage nodes, a first controlled switching device having a current path connecting the data line to one of the first and second storage nodes and being controlled by the address line, a voltage supply, impedance means connecting the second storage node to the voltage supply, voltage-controlled resistance means connecting the first storage node to the second storage node, wherein the resistance means is formed by an elongated ion implanted region in the semiconductor material of low net impurity concentration buried beneath thick field oxide, the second storage node being connected to the control element of a second controlled switching device, the second controlled switching device connecting the first storage node to reference potential.

* * * * *